(12) United States Patent
Fan

(10) Patent No.: US 6,798,200 B2
(45) Date of Patent: Sep. 28, 2004

(54) BATCH-FABRICATED GRADIENT AND RF COILS FOR SUBMICROMETER RESOLUTION MAGNETIC RESONANCE IMAGING AND MANIPULATION

(76) Inventor: Long-Sheng Fan, 7103 Martwood Way, San Jose, CA (US) 95120

( * ) Notice: Subject to any disclaimer, the term of this patent is extended or adjusted under 35 U.S.C. 154(b) by 0 days.

(21) Appl. No.: 10/453,151

(22) Filed: Jun. 2, 2003

(65) Prior Publication Data

US 2003/0222648 A1 Dec. 4, 2003

Related U.S. Application Data

(60) Provisional application No. 60/385,686, filed on Jun. 3, 2002.

(51) Int. Cl.[7] .................................................. G01V 3/00
(52) U.S. Cl. ....................................... 324/309; 324/307
(58) Field of Search ................................. 324/309, 307, 324/314, 318; 204/403, 400

(56) References Cited

U.S. PATENT DOCUMENTS

| | | | | |
|---|---|---|---|---|
| 4,777,019 A | * | 10/1988 | Dandekar | ................. 422/82.02 |
| 6,123,819 A | * | 9/2000 | Peeters | ........................ 204/452 |
| 6,242,915 B1 | * | 6/2001 | Hurd | ........................... 324/309 |
| 6,325,904 B1 | * | 12/2001 | Peeters | ......................... 257/414 |
| 2003/0158474 A1 | * | 8/2003 | Scherer et al. | .............. 600/409 |

FOREIGN PATENT DOCUMENTS

WO    WO 01/73460 A1 *  3/2001

* cited by examiner

*Primary Examiner*—Brij B. Shrivastav
(74) *Attorney, Agent, or Firm*—Pacific Law Group LLP; Chi Ping Chang

(57) ABSTRACT

A batch micro-fabricable array of dimensionally scaled-down Integrated Micro Coil Structure (IMCS) having a plurality of multi-layer gradient coils and a set of RF coils is disclosed for Magnetic Resonance Imaging (MRI). The coil traces are made of electrically conductive material. The key scaled-down parameters include a maximum coil size of about 20 μm in diameter, a minimum layer thickness of about 20 μm, an analysis chamber size of 50 μm and an overall IMCS size of less than 10 mm. Coupled with an external MRI electronic driving and signal acquisition system, the IMCS functions to capture the three dimensional image of a magnetic nano article, located within the IMCS analysis chamber, with a high resolution of less than a μm. Also disclosed is a method of driving a small magnetic object having a magnetic moment, also located within the analysis chamber, by properly energizing the gradient coils.

19 Claims, 6 Drawing Sheets

BATCH-FABRICATED GRADIENT AND RF COILS FOR SUBMICROMETER RESOLUTION MAGNETIC RESONANCE IMAGING AND MANIPULATION

CROSS REFERENCE TO RELATED APPLICATIONS

This utility patent application is based upon thus claims the priority of a provisional application, Ser. No. 60/385,686, filed Jun. 3, 2002, by the same inventor.

BATCH-FABRICATED GRADIENT GLOSSARY

CMP: Chemical Mechanical Polishing
DRIE: Deep Reactive Ion Etching
IMCS: Integrated Micro Coil Structure
MEMS: Micro Electro Mechanical System
MRI: Magnetic Resonance Imaging
NMR: Nuclear Magnetic Resonance
Pixel: picture element
PECVD: Plasma-Enhanced Chemical Vapor Deposition
RIE: Reactive Ion Etching
RF: Radio Frequency
SNR: Signal to Noise Ratio
3D: three-dimensional
UV LIGA: Ultra Violet LIGA
Voxel: volume element

FIELD OF THE INVENTION

This invention relates to the field of Magnetic Resonance Imaging (MRI). Specifically, the present invention is directed to an array of vastly miniaturized MRI structures and method of its manufacturing for a new MRI system with very high resolution down to the sub-micron range.

BACKGROUND OF THE INVENTION

MRI has offered a powerful, non-intrusive 3D imaging technique for various medical, engineering and scientific studies. This is achieved by spatially coding the precessing frequencies or phases of nuclear magnetic moments of a sample under study under a bias magnetic field, typically 0.5 Tesla to 10's of Tesla, and using Radio Frequency (RF) coils to excite and detect emitted signals with a certain sequence. A three-dimensional (3D) image is then reconstructed after signal processing with a processor. For medical diagnosis, a resolution of a few millimeters is typically adequate. However, if the subject under study is an organ of a small animal, then a Nuclear Magnetic Resonance (NMR) microscope is required. The resolution of current MRI is limited in practice from going below a few millimeters for medical imaging, or below a few micrometers for NMR microscopy or micro MRI imaging.

In many medical and scientific studies, it is desirable to have the ability to perform 3D imaging to track magnetic or magnetically labeled nano-sized elements or molecules, or to be able to look into cell to cell interaction, cell cycles, embryo cells, cancer cells development, cell infection or toxicity response etc. However, when it comes to small samples such as a small cluster of cells or even a single cell, a sub-micrometer imaging resolution is needed. For small samples, the MRI resolution is typically limited by the ability of the gradient coils to generate a large enough and uniform magnetic field gradient for the receiving system to have enough signal to noise ratio since the total magnetic moment responsible for generating certain frequency signal scales with the pixel volume. While averaging with multiple measurements can reduce the level of uncorrelated noise with the square root of the number of measurements, the cost of the resulting measurement time becomes prohibitive.

The inability to generate a large enough magnetic field gradient also limits the ability to manipulate small magnetic moments. To exert a sufficient net force on small magnetic particles/molecules, for sorting, manipulation etc., requires the ability to generate a large enough magnetic field gradient as the net force acted on a magnetic moment is proportional to the magnetic field gradient.

In essence, it is desirable to develop new systems capable of sub-micrometer imaging resolution for MRI and capable of manipulating small magnetic moments of nanometer-sized particles.

SUMMARY OF THE INVENTION

The first object of this invention is to achieve a new MRI system capable of sub-micrometer imaging resolution.

The second object of this invention is to batch-manufacture such a new MRI system with low cost.

A third object of this invention is to have such new MRI system capable of manipulating small magnetic moments.

Other objects, together with the foregoing are attained in the exercise of the invention in the following description and resulting in the embodiment illustrated in the accompanying drawings.

BRIEF DESCRIPTION OF DRAWINGS

The current invention will be better understood and the nature of the objects set forth above will become apparent when consideration is given to the following detailed description of the preferred embodiments. For clarity of explanation, the detailed description further makes reference to the attached drawings herein.

DETAILED DESCRIPTION OF THE PREFERRED EMBODIMENTS

Figure 1A:
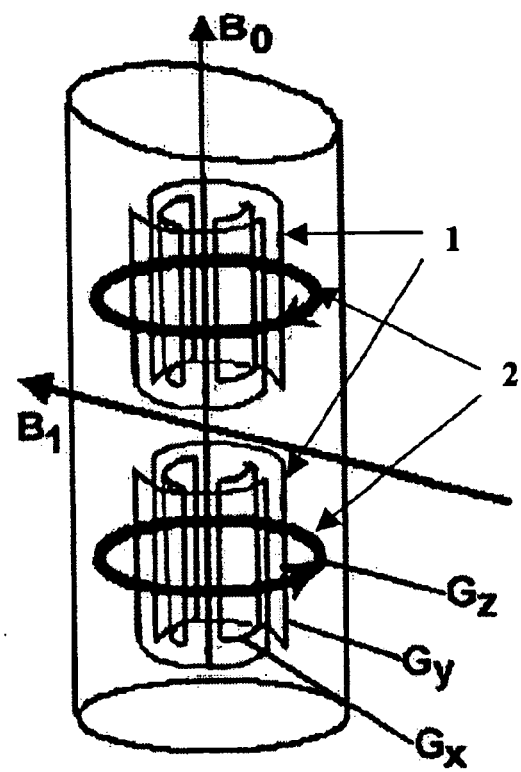
FIG. 1a is a perspective illustration of a set of gradient coils employed in a conventional MRI system.

In the following detailed description of the present invention, numerous specific details are set forth in order to provide a thorough understanding of the present invention. However, it will become obvious to those skilled in the art that the present invention may be practiced without these specific details. In other instances, well known methods, procedures, components, and circuitry have not been described in detail to avoid unnecessary obscuring aspects of the present invention. The detailed description is presented largely in terms of logic blocks and other symbolic representations. These descriptions and representations are the means used by those skilled in the art to concisely and most effectively convey the substance of their work to others skilled in the art. Reference herein to "one embodiment" or an "embodiment" means that a particular feature, structure, or characteristics described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations of the invention.

The present invention proposes to vastly scale down the conventional MRI components. A medical MRI instrument typically uses a coil current of the order of 100 Ampere to generate a magnetic field gradient around 1 Gauss/cm. This will give a millimeter spatial resolution. For small samples, the detectable signal is proportional to the magnetic moment of the volume element (voxel) while the noise is primarily the Johnson noise of the gradient coil. Therefore, by using a smaller gradient coil and RF coil set and optimizing the detection circuit, the corresponding NMR microscope can generate hundreds Gauss/cm and obtain a resolution from tens of micrometers down to a few micrometers. Miniaturization of MRI field components is desirable when the size of the subject under imaging is very small such as a cluster of cells or a single cell. This miniaturization offers several advantages as follows:

(A) High field gradients and curvatures. As magnetic field gradients scale with the inverse $2^{nd}$ power of the size, a magnetic field gradient of 10's to 100's T/m (Tesla per meter), versus $10^{-2}$ T/m in a typical MRI system, is achievable with a microfabricated gradient coil tens of micrometers in size while only requiring a coil current of a fraction of an Ampere.

(B) Higher sensitivity RF coils. According to the Reciprocal Theorem, the RF pick up signal is proportional to the integration over the volume of the product of magnetic moment and the magnetic field generated by a unit of electrical current in the RF coil. As the magnetic field generated by a unit of electrical current is inversely proportional to the RF coil size, detection sensitivity is increased from the scaled down process.

(C) High-resolution MRI. The corresponding voxel resolution of the above magnetic field gradients is improved down to less than 10 nanometers. However, the practically achievable resolution is limited by the achievable signal-to-noise ratio as the corresponding magnetic moments of the voxel are reduced. The net result is that a resolution of 100 nanometers, versus a range of mm to $\mu$m (micrometer) in a typical MRI system, is achievable with the microfabricated integration approach.

(D) Low-power consumption. The power consumption, following miniaturization of MRI field components, by the coils is much smaller as the electrical current needed to achieve the SNR-limited resolution is greatly reduced. For example, a 1000-fold down scaling of the size leads to a 100,000-fold reduction in the required currents of gradient coils to achieve 10 folds of magnetic field gradients while no more than a 1,000-fold increase in coil resistance. With the same physical scaling law, 1,000 folds of magnetic field gradients can be achieved with manageable power consumption. At high frequency, the resistance of the coil, when scaled proportionally (constant length-to-circumference ratio), is almost constant due to the conductor skin depth effect. The net effect is that the resistive loss of an individual coil, called nanoMRI coil for convenience, is reduced 10 million fold. This makes the design of current driving circuitry and system thermal management much easier even in an array environment wherein a thousand of these nanoMRI coils are deployed.

While the concept of miniaturization of MRI field components of the present invention can now be seen to be highly desirable, these miniaturized MRI field components do have to be microfabricated and this does pose huge technical challenges under current manufacturing technology. This is because the required precision and tolerances could render the targets impractical or extremely expensive to achieve. However, the present invention proposes to leverage the miniaturization technology used in the electronics industry to achieve these targets. Notwithstanding the adoption of advanced integration process used in current microfabrication technology, the requirements to implement the three-dimensional (3D) MRI field components still present great challenges. These requirements are enumerated below:

1. Need relatively thick layers: Tens of micrometers are required to be compatible with cell sizes when biological application is the goal.
2. Need high resolutions down to micrometer feature size to accommodate various coil structures in an array configuration under batch fabrication.
3. Need high thickness-to-resolution aspect ratio from the above requirements.
4. Need good conductivity of structure material to reduce the power requirement and to ease thermal management.
5. Need multiple layers to implement the 3D structures of the required gradient coils and RF coils.
6. Must be manufacturable with low cost.

Most MEMS (Micro Electro Mechanical System) process technologies for high depth-to-width aspect ratios, such as Silicon Deep Reactive Ion Etching (Si DRIE), UV and X-ray LIGA, can only partially meet the above technology requirements needed to implement the MRI miniaturization. For example, Si DRIE can make a single-layer, thick, high aspect ratio structure out of Silicon, but Silicon, even in its heavily-doped state, is too resistive to be suitable for a low-noise RF coil or low-power gradient coils. Additionally, the Si DRIE process is restricted to a single layer. Other process technique such as UV LIGA based on SU8 epoxy does not have enough resolution when the layer thickness gets up to tens of $\mu$m thick, and is not, same as X-ray LIGA, easily extendable to multi-layer structures.

The present invention, to be presently described, proposes to use a microfabrication process technology characterized by multiple, thick layers with high-resolution (for example 0.2 $\mu$m to 2 $\mu$m), high thickness-to-width aspect ratio, electrically conductive structures (Cu, Permalloy, Invar, Ni, Au, etc.) to implement the required miniaturization of MRI field components in a nanoMRI array system.

Figure 1B:
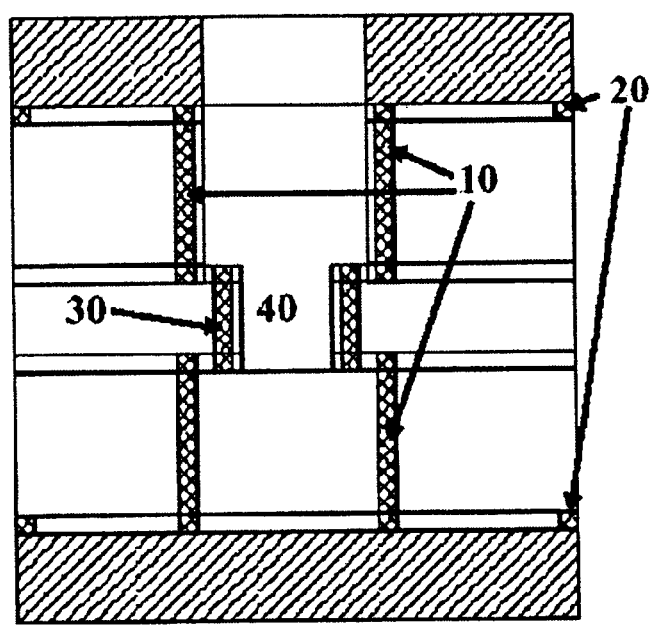
FIG. 1b is a cross-sectional view of the proposed miniaturization of an integrated version of the set of MRI gradient coils and RF coils according to the present invention.

FIG. 1a is a perspective illustration of a set of gradient coils employed in a conventional MRI system while FIG. 1b is a cross-sectional view of the proposed miniaturization of an integrated version of the set of MRI gradient coils according to the present invention. As shown in FIG. 1a, a classical MRI gradient coils configuration uses the double-saddle coils (Golay coils) 1 and Helmholtz coils 2 to generate a uniform magnetic field gradient while allowing an axial access opening. The corresponding integrated version of the Golay gradient coils 10, RF saddle coils 30 and an analysis well 40 for cell samples are shown in FIG. 1b. The associated magnetic fields can be expressed as a series with Legendre polynomials. To optimize the uniformity of the magnetic field gradient, the radius, spacing and length of these coils are chosen such that the associated coefficients cancelled out to high order terms. A typical target is to achieve a magnetic field gradient uniformity of less than 5 % variation in the analysis chamber. In the integrated version for miniaturization, the Gz gradient coils 20 are enlarged, thus the associated uniformity zone, relatively to Gx and Gy 10 to simplify the integration process leverage on the required electrical current in an SNR-limited system. Not shown in the schematic are the active shielding coils that can also be integrated in the same process.

Figure 2A:
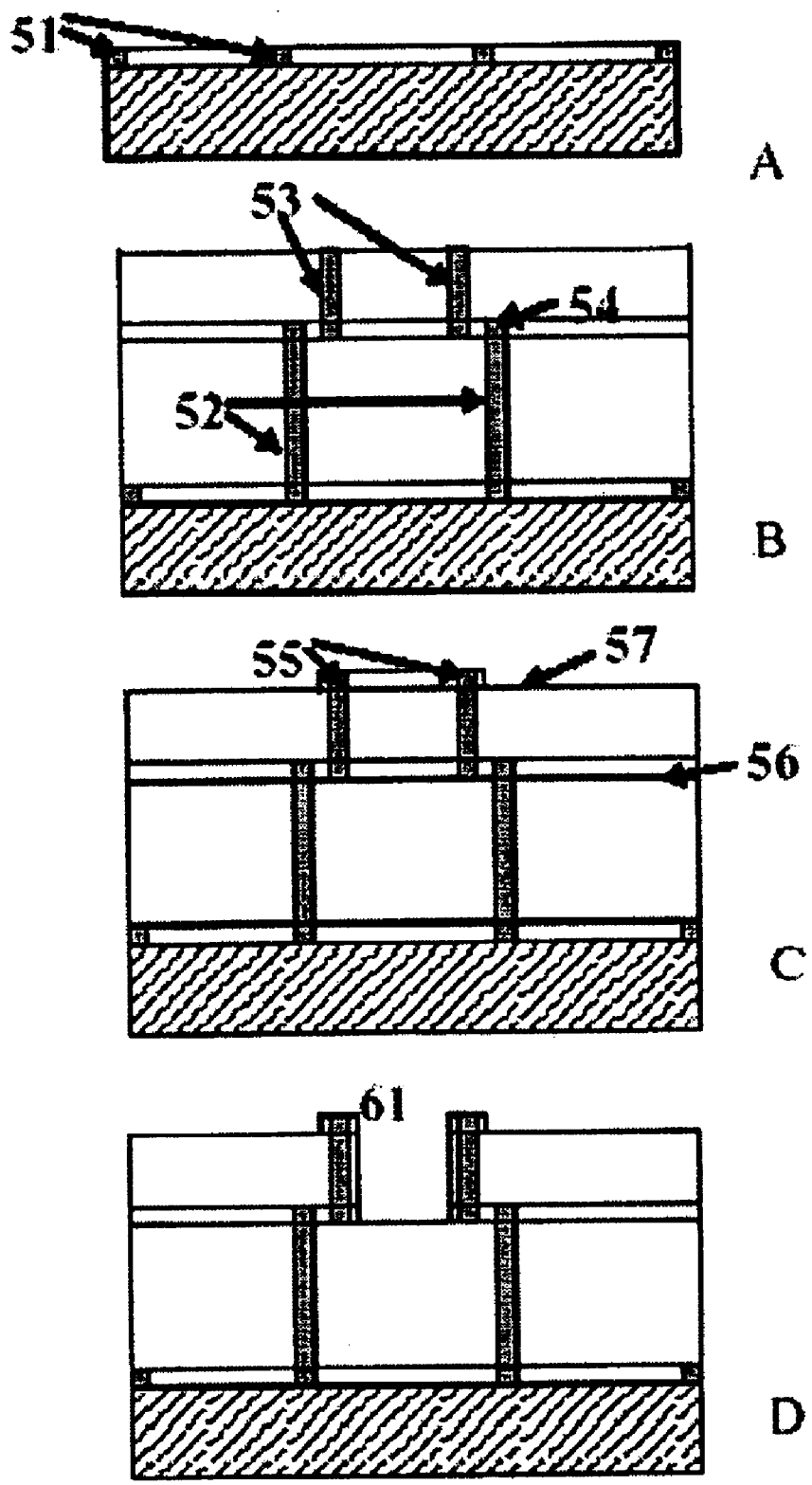
FIGS. 2a and 2b show an outline of the fabrication sequence, except a last assembly step, of the integrated version of the set of MRI gradient coils and RF coils of the present invention.
Figure 2B:
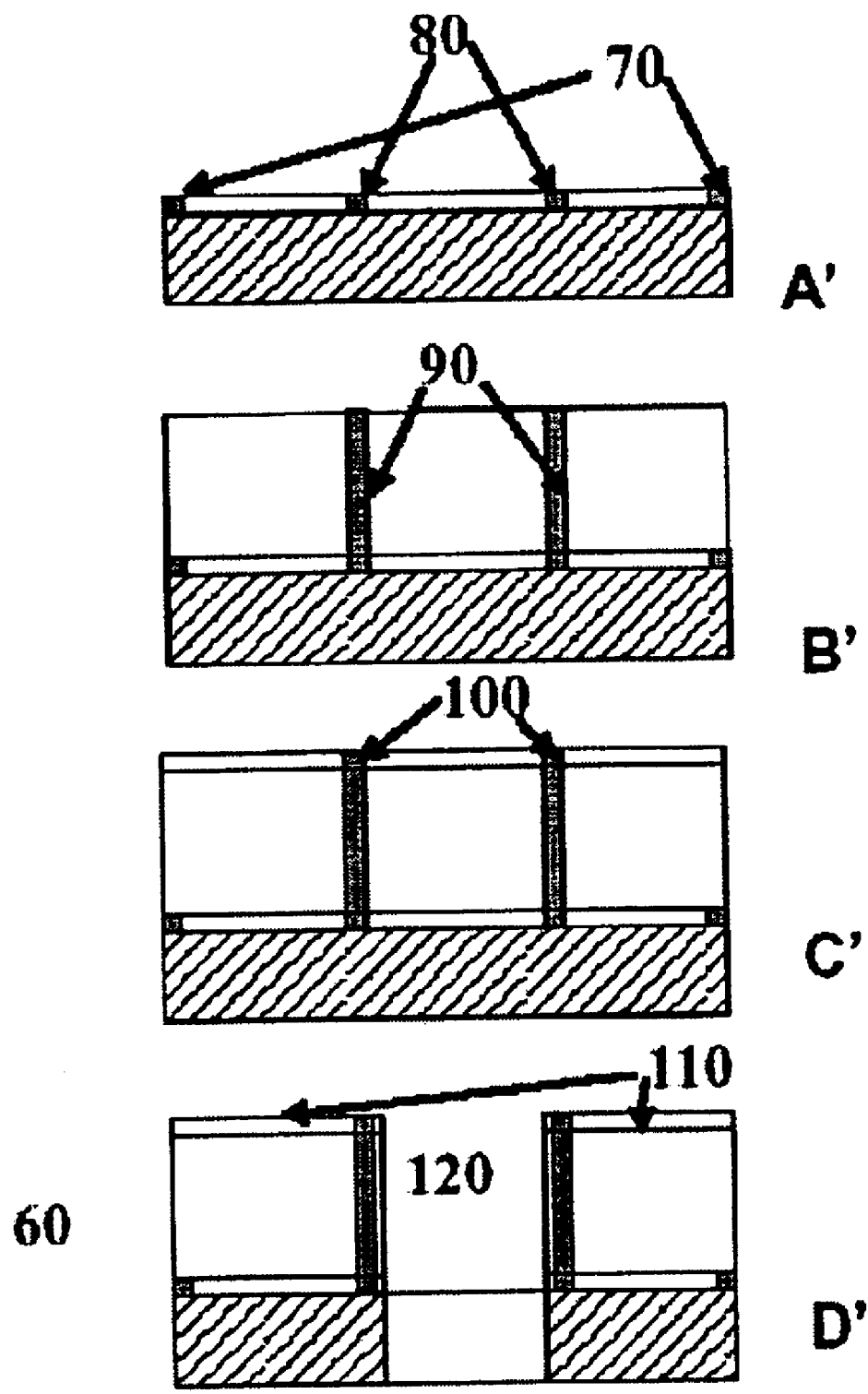
Figure 3:
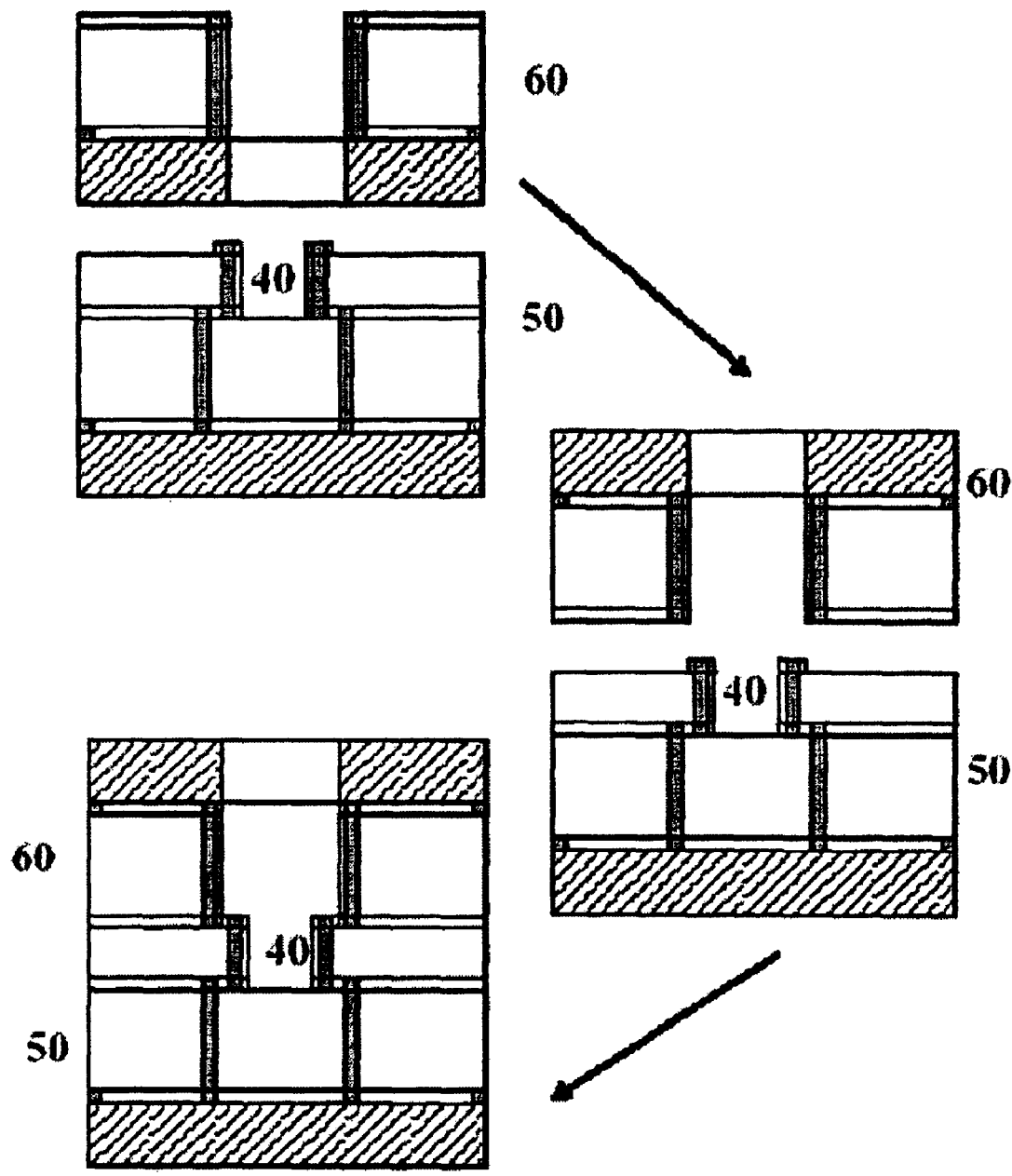
FIG. 3 illustrates the last assembly step of the fabrication sequence of the integrated version of the set of MRI gradient coils and RF coils of the present invention.

The nanoMRI array fabrication process is illustrated in FIGS. 2a and 2b and FIG. 3. To increase the yield and to reduce the integration cost, two modular components, a cell-carrier plate 50 and a top cover plate 60, respectively made by a microfabrication process, form the nanoMRI array 130.

To make the cell-carrier plate 50, the substrate is passivated, for example, by using Silicon Nitride, polymers and/or Silicon dioxides for electrical insulation and a metal structure layer 51 is made by electrochemical forming into a plating mold defined photolithographically as shown in part A of FIG. 2a. This layer is used to form the Helmholtz coil 20 and the return paths of x- and y-gradient saddle coils 10. The plating seed layer is removed and, after a planarization process (for example, by using RIE, lapping and/or Chemical Mechanical Polishing (CMP)), similar process sequences are repeated several times to form the main conductors 52, 53 of x- and y-gradient coils 10, RF coil 30 and their return paths 54 as shown in part B of FIG. 2a. Etch stop layers 56, 57 are deposited after the first repeat as shown in part C of FIG. 2a. Finally, the return path 55 of the RF coil 30 is formed in part C of FIG. 2a and an etch back process step is done until it stops at the etch stop layer 57 to form the alignment socket lips 61. The cell-well is formed in another etch process using a metal hard mask with the etch depth defined by the etch stop layer 56, a passivation layer such as Plasma-Enhanced Chemical Vapor Deposition (PECVD) Silicon Nitride (or Silicon dioxide, polymer etc.) is deposited and a patterned thin solder layer is plated on the surface for later assembly as shown in part D of FIG. 2a As the process is of a surface micromachining type, the selection of the substrate material (such as glass, alumina and other ceramics, etc.) has a lot more flexibility than many other processes.

To make the top cover plate 60, as illustrated in parts A'–D' of FIG. 2b, a fabrication process sequence similar to that used in making the cell-carrier plate 50 is used to microfabricate the mating top cover plate 60 of the nanoMRI array 130. However, the top cover plate 60 involves less number of structural layers. Also, the central opening of the top cover plate 60 is etched through its substrate. As shown in part A' of FIG. 2b, the substrate is first passivated for electrical insulation and a metal structure layer is made by electrochemical forming into a photo-lithographically defined plating mold. This layer is used to form the other coil 70 of the Helmholtz pair and the return paths 80 of the other x- and y-gradient saddle coils. After a planarization process, similar process sequences are repeated twice to form the main conductors of x- and y-gradient saddle coils 90 as shown in part B' of FIG. 2b. The return paths 100 of the gradient coils are formed and a patterned thin solder layer 110 is plated for later assembly as shown in part C' of FIG. 2b. Finally, the central opening 120 is etched using a thin-film metal hard mask to the substrate to meet yet another etch through of the substrate as shown in part D' of FIG. 2b. The metal hard mask is then removed and a PECVD passivation layer is deposited afterwards.

Next, a Self-aligned assembly process is shown in FIG. 3 wherein the top cover plate 60 is flipped and aligned to the mating cell-carrier plate 50 and bonded together using a self-aligned solder reflow process. The surface tension of the matching solders 110 on both surfaces brings the two plates together with a sub-micrometer alignment accuracy. Optionally, the substrate 62 of the top cover plate 60 may be removed for easy access.

Figure 4:
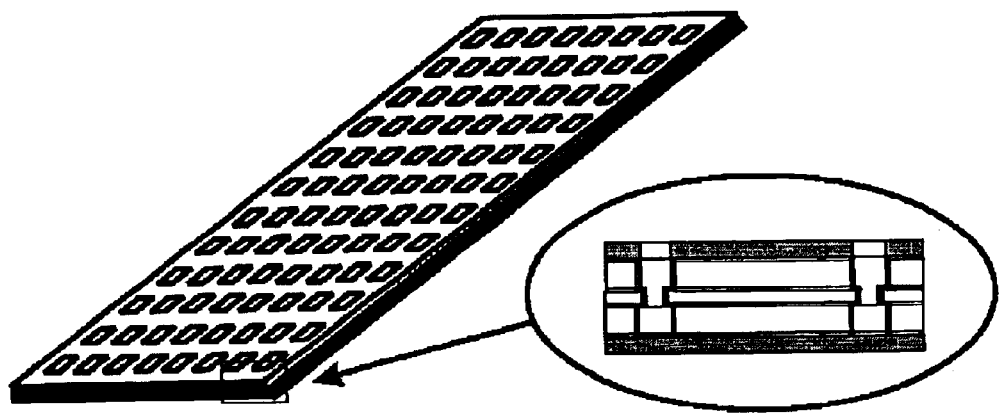
FIG. 4 illustrates a specific embodiment of an array of the integrated version of the present invention.

FIG. 4 illustrates a specific embodiment of an array of the integrated version of the present invention wherein a NanoMRI array in a 96-well micro plate format is presented. Here, cell samples will be loaded by an automatic system into the nanoMRI analysis chambers 40.

Figure 5:
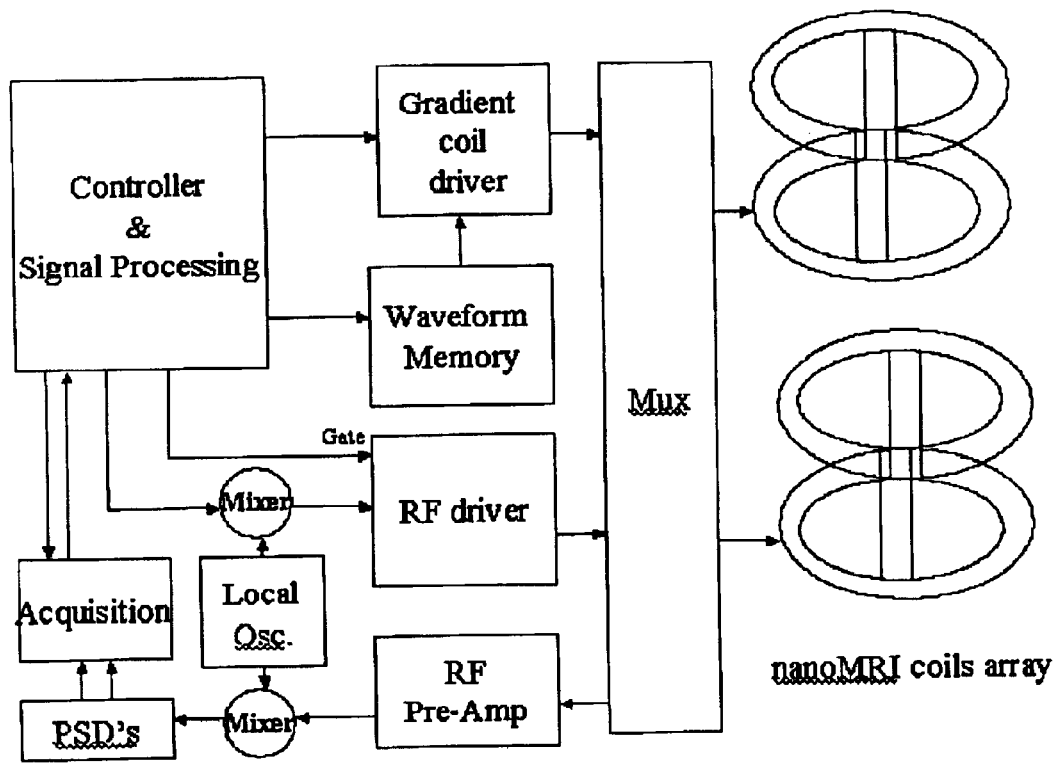
FIG. 5 illustrates the schematics of an array of the integrated version of the present invention working in conjunction with an external MRI electronic driving and RF signal acquisition system.

FIG. 5 illustrates the schematics of an array of the integrated version of the present invention working in conjunction with an external MRI electronic driving and RF signal acquisition system. An external magnet, not shown here, will be used to generate a required static biasing magnetic field. Also, an adaptive driver and RF circuitry can be built utilizing a standard MRI system and its associated image processing software.

Figure 6:
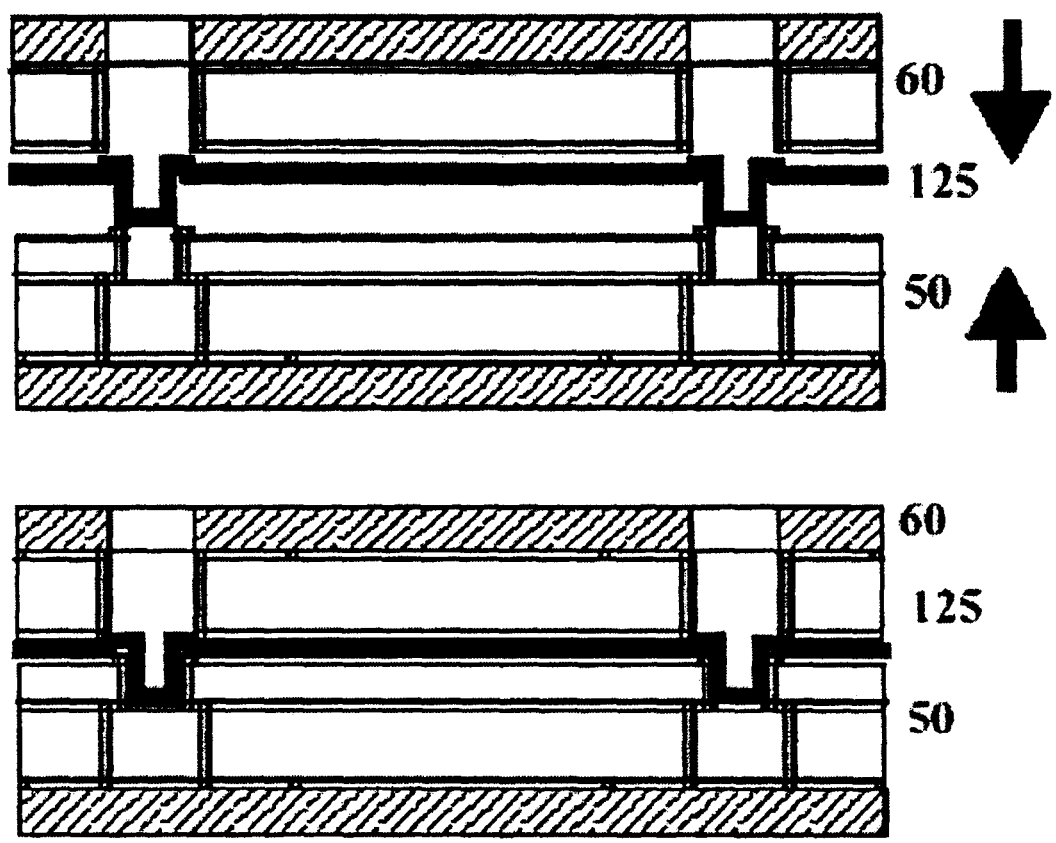
FIG. 6 illustrates an alternative embodiment of the fabrication of the integrated version of the set of MRI gradient coils and RF coils of the present invention using a three-part modular approach.

FIG. 6 illustrates an alternative embodiment of the fabrication of the integrated version of the set of MRI gradient coils of the present invention using a three-part modular approach with an injection molded thin micro plate 125 sandwiched between the nanoMRI field components 50 and 60. This can potentially further reduce the cost as the micro plate 125 is disposable.

Another important application of the nanoMRI array of the present invention is magnetic nano particle labeling and magnetic nano-maneuvering. Specifically, as the peak magnetic field gradient in the cell well can be controllably tuned to above 100 T/m, it can be used to selectively maneuver magnetically labeled molecules within the cell chamber without breaking the bonds. Magnetic labeling can be done by binding matching biomolecules such as oligos, aptomers, antibodies onto the surfaces of magnetic nano particles and then introducing these particles into cells for hybridization onto the target molecules or other small structures. Externally controllable magnetic fields are applied to manipulate these elements using the nanoMRI gradient coils and possibly in combination with electrical fields and optical beams. For a commercially available ferrite super-paramagnetic particle of size 30 nm, the force exerted upon the particle will be a few femto Newton as compared to a typical covalent bonding force of nano Newtons, or a typical ligand binding (such as biotin/avidin binding) of 100 pico Newtons. As the magnetic force scales as the cube of the particle size and when the particle size reaches 1 $\mu$m, the magnetic force under the 100 T/m gradient becomes adequate to tear the ligand bonds apart. For a particle to go through a cell membrane, the particle size needs to be less than 10 nm and the associated maximum magnetic force is small but could potentially be used to induce certain cell process.

As described, a nanoMRI array and its associated microfabrication process are disclosed based upon a dimensionally vastly scaled-down field components of a conventional MRI system. Consequently, the nanoMRI array of the present invention offers an MRI capable of sub-micrometer imaging resolution and, additionally, capable of manipulating small magnetic nano particles located within its analysis chamber. The invention has been described using exemplary preferred embodiments. However, for those skilled in this field, the preferred embodiments can be easily adapted and modified to suit additional applications without departing from the spirit and scope of this invention. Thus, it is to be understood that the scope of the invention is not limited to the disclosed embodiments. On the contrary, it is intended to cover various modifications and similar arrangements based upon the same operating principle. The scope of the claims, therefore, should be accorded the broadest interpretations so as to encompass all such modifications and similar arrangements.

What is claimed are:

1. A batch-fabricated array of dimensionally scaled-down Integrated Micro Coil Structure (IMCS) wherein each IMCS having a plurality of multi-layer gradient coils and a set of multi-layer Radio Frequency (RF) coils for high resolution Magnetic Resonance Imaging to capture the time evolution of a three dimensional image of an object, the IMCS comprising, expressed in an x-y-z Cartesian coordinate system:

an x-gradient coil set generating, when energized with an x-gradient coil current, a magnetic field B1 with a uniform x-gradient;

a y-gradient coil set co-located with said x-gradient coil set, said y-gradient coil set generating, when energized with a y-gradient coil current, a magnetic field B2 with a uniform y-gradient and substantially overlapping the uniform space of the said magnetic field B1;

a z-gradient coil set co-located with said x-gradient coil set and said y-gradient coil set, said z-gradient coil set generating, when energized with a z-gradient coil current, a magnetic field B3 with a z-gradient and substantially overlapping the uniform gradient space of said magnetic field B1 and said magnetic field B2 thus defining an analysis chamber being the spatial zone of overlapping of said uniform gradient space of said magnetic fields B1, B2 and B3;

an RF coil set for, when coupled with an external RF power driver and an external RF receiver, generating and introducing an RF excitation into said analysis chamber and detecting an RF signal emitted from said analysis chamber;

a shielding coil set for compensating magnetic field components to achieve a desired magnetic field pattern outside of said analysis chamber;

the coil traces of said x-, y- and z-gradient coil sets, said RF coil set and said shielding coil set being made of an electrically conductive material; and where the key scaled-down geometric parameters having the following ranges:

a maximum wire size in the range of about 10 $\mu$m to 50 $\mu$m for said x-, y- and z-gradient coil sets, said RF coil set and said shielding coil set;

a minimum layer thickness of about 20 $\mu$m;

said analysis chamber size being in a range of about 25 $\mu$m to 100 $\mu$m; and the overall size, in terms of a maximum overall linear dimension, of said IMCS being less than or equal to about 10 mm.

2. The array of dimensionally scaled-down IMCS of claim 1 wherein said electrically conductive material for said coil traces being selected from the group consisting of Copper, Permalloy, Invar, Nickel and Gold.

3. The array of dimensionally scaled-down IMCS of claim 1 wherein the detailed geometry and orientation of said x-gradient coil set and said y-gradient coil set is a Golay coil.

4. The array of dimensionally scaled-down IMCS of claim 1 wherein the detailed geometry and orientation of said z-gradient coil set is a Helmholtz pair.

5. The array of dimensionally scaled-down IMCS of claim 1 wherein the detailed geometry and orientation of said RF coil set is an RF saddle coil.

6. The array of dimensionally scaled-down IMCS of claim 1 wherein the captured three dimensional image having a high spatial resolution, being equal to or less than a $\mu$m.

7. The array of dimensionally scaled-down IMCS of claim 1 wherein a highly uniform, within about 5%, high magnetic field gradient of at least about 10 T/m (Tesla per meter) is generated within said analysis chamber.

8. The array of dimensionally scaled-down IMCS of claim 1 wherein said x-, y- and z-gradient coil sets require only a low operating current of no more than an Ampere.

9. A method of batch microfabricating an array of dimensionally scaled-down IMCS wherein each IMCS having a maximum overall linear dimension of less than or equal to about 10 mm and having an x-gradient coil set, a y-gradient coil set and a z-gradient coil set expressed in an x-y-z Cartesian coordinate system and being spatially arranged to define an analysis chamber, which is coupled with a set of multi-layer RF coils and a shielding coil set for high resolution MRI wherein said x-, y- and z-gradient coil sets, said RF coil set and said shielding coil set having a maximum wire size in the range of about 10 $\mu$m to 50 $\mu$m comprising the steps of:

(a) making a cell-carrier plate with the following steps:

(a1) providing and passivating a substrate for electrical insulation;

(a2) forming, atop the passivated substrate, a metallic structure layer, destined to form a first coil of said z-gradient coil set and one part of return paths of said x- and y-gradient coil sets, by an electrochemical forming process into a photo-lithographically defined plating mold;

(a3) removing a plating seed layer associated with step (a2);

(a4) planarizing the top surface with a polymer layer and using Reactive Ion Etching (RIE), lapping or Chemical Mechanical Polishing (CMP);

(a5) depositing two etch stop layers till the complete formation of the main coil traces of said x- and y-gradient coil sets plus all their return paths and said RF coil set;

(a6) forming a return path of said RF coil set;

(a7) etching back said polymer layer with automatic stop at the first one of said two etch stop layers to form a number of alignment socket lips;

(a8) forming a cell-well with another etch process using a metal hard mask wherein the etch depth is defined by the second one of said two etch stop layers;

(a9) depositing a passivation layer that is Silicon Nitride, Silicon dioxide or polymer; and (a10) plating and patterning a patterned thin solder layer on the top surface for later assembly;

(b) making a top cover plate with the following steps:

(b1) providing and passivating a substrate for electrical insulation;

(b2) forming, atop the passivated substrate, a metallic structure layer, destined to form a second coil of said z-gradient coil set and the other part of the return paths of said x- and y-gradient coil sets, by an electrochemical forming process into a photo-lithographically defined plating mold;

(b3) removing a plating seed layer associated with step (b2);

(b4) planarizing the top surface using RIE, lapping or CMP;

(b5) repeating steps (b2) through (b4) till the complete formation of the main coil traces of said x- and y-gradient coil sets plus all their return paths and said RF coil set;

(b6) forming the return paths of said x- and y-gradient coil sets;

(b7) plating and patterning a patterned thin solder layer, with a pattern matching that of step (a10), on the top surface for later assembly;

(b8) etching a central opening using a thin-film metal hard mask through the substrate;

(b9) removing said thin-film metal hard mask; and (b10) depositing a passivation layer that is Silicon Nitride, Silicon dioxide or polymer; and (c) assembling said cell-carrier plate with said top cover plate with the following steps:

(c1) flipping the top cover plate from step (b) and aligning the flipped top cover plate to the cell-carrier plate from step (a);

(c2) bonding the aligned top cover plate and cell-carrier plate together using a self-aligned solder reflow process predicated upon the matching thin solder patterns of steps (a10) and (b7); and (c3) removing, as an option, the substrate of the top cover plate for easy access.

10. The method of batch microfabricating an array of dimensionally scaled-down IMCS of claim 9 wherein said substrate is made of glass, alumina or other ceramics.

11. The method of batch microfabricating an array of dimensionally scaled-down IMCS of claim 9 further comprising making an injection molded thin micro plate, and sandwiching said thin micro plate between said cell-carrier plate and said top cover plate before step (c).

12. The method of batch microfabricating an array of dimensionally scaled-down IMCS of claim 9 wherein said steps (a1) and (b1) employ Silicon Nitride, Silicon dioxide or polyme for electrical insulation.

13. The method of batch microfabricating an array of dimensionally scaled-down IMCS of claim 9 wherein said passivation layer of steps (a9) and (b10) is formed by Plasma-Enhanced Chemical Vapor Deposition (PECVD).

14. A method of driving, causing a corresponding trajectory of movement, a small magnetic object having a magnetic moment and being disposed within a dimensionally scaled-down IMCS wherein each IMOS having a maximum overall linear dimension of less than or equal to about 10 mm and having an x-gradient coil set, a y-gradient coil set and a z-gradient coil set expressed in an x-y-z Cartesian coordinate system and being spatially arranged to define an analysis chamber, which is coupled with a set of multi-layer RF coils and a shielding coil set for high resolution MRI, comprising the steps of:

a) providing x-, y- and z-gradient coil sets, the RF coil set and the shielding coil set having a maximum wire size in the range of about 10 $\mu$m to 50 $\mu$m, b) introducing a small magnetic object within said analysis chamber;

c) for an x-component force, if desired, energizing said x-gradient coil set with a pre-determined polarity and amount of x-gradient coil current thus generating a magnetic field Bz1 with an x-gradient causing said x-component force, being proportional to said x-gradient, to be exerted on said magnetic object;

d) for a y-component force, if desired, energizing said y-gradient coil set with a pre-determined polarity and amount of y-gradient coil current thus generating a magnetic field Bz2 with a y-gradient causing said y-component force, being proportional to said y-gradient, to be exerted on said magnetic object; and e) for a z-component force, if desired, energizing said z-gradient coil set with a pre-determined polarity and amount of z-gradient coil current thus generating a magnetic field Bz3 with a z-gradient causing said z-component force, being proportional to said z-gradient, to be exerted on said magnetic object.

15. The driving method of claim 9 further comprising a preparatory magnetic labeling step of binding a target non-magnetic object with a magnetic carrier having a magnetic moment to form said small magnetic object such that said target non-magnetic object is indirectly driven via said small magnetic object.

16. The driving method of claim 10 wherein said magnetic carrier is a magnetic nano particle.

17. The driving method of claim 11 wherein said magnetic nano particle is a ferritesuper-paramagnetic particle.

18. The driving method of claim 10 wherein said target non-magnetic object is a biomolecule or a collection of biomolecules.

19. The driving method of claim 13 wherein said biomolecules are oligos, aptomers or antibodies.

* * * * *